United States Patent [19]

Keaton

[11] Patent Number: 4,914,829
[45] Date of Patent: Apr. 10, 1990

[54] IMAGE ALIGNMENT INDICATORS

[75] Inventor: William R. Keaton, Genoa, Ill.

[73] Assignee: AG Communication Systems Corporation, Phoenix, Ariz.

[21] Appl. No.: 285,558

[22] Filed: Dec. 16, 1988

[51] Int. Cl.[4] .......................... G01B 5/24; H05K 3/36
[52] U.S. Cl. .......................................... 33/613; 29/830
[58] Field of Search ................ 33/614, 623, 617, 619, 33/645, 1 B, 613; 29/825, 830; 361/397, 398, 414

[56] References Cited

U.S. PATENT DOCUMENTS

| | | | |
|---|---|---|---|
| 1,151,461 | 8/1915 | Hatt | 33/617 |
| 2,795,851 | 6/1957 | Sampson | 33/1 B |
| 3,516,156 | 6/1970 | Steranko | 29/830 |
| 3,889,383 | 6/1975 | Jahn | 33/613 |
| 3,913,219 | 10/1975 | Lichtblau | 361/402 |
| 4,521,262 | 6/1985 | Pellegrino | 174/68.5 |
| 4,628,406 | 12/1986 | Smith et al. | 361/414 |
| 4,702,785 | 10/1987 | Burger | 29/830 |
| 4,739,448 | 4/1988 | Rowe et al. | 361/414 |
| 4,827,626 | 5/1989 | Wieland | 33/614 |

FOREIGN PATENT DOCUMENTS 2917472 11/1980 Fed. Rep. of Germany ........ 29/830
45-33826 10/1967 Japan .................................... 29/825

OTHER PUBLICATIONS

Goodman, H. A. et al., "Integrated Packaging for Transparent Elastic Diaphragm Switch", *IBM Technical Disclosure Bulletin*, vol. 15, No. 2, p. 544 (Jul. 1972).

Primary Examiner—Allan N. Shoap
Assistant Examiner—Diego F. F. Gutierrez
Attorney, Agent, or Firm—Robert J. Black; Gregory G. Hendricks

[57] ABSTRACT

The addition of registration marks as an aid in projecting a precision location of a screened artwork or master pattern as used in printing of thick film circuits on a ceramic substrate base is taught by the present invention. The marks are located in a number of locations on the artwork that correspond to a location which will be determined as the edge of the substrate base when the substrate base is printed in proper registration on the artwork to which the registration marks have been added.

6 Claims, 1 Drawing Sheet

IMAGE ALIGNMENT INDICATORS

BACKGROUND OF THE INVENTION

1. Field of the Invention

The present invention pertains to the making of thick film circuitry and more particularly to a novel registration pattern useful in aligning screened artwork as used in printing on a ceramic substrate base.

2. Background Art

At the present time, the alignment or registration of an imaged screen to a ceramic substrate for the first layer of printing a thick film circuit onto the ceramic substrate base is a tedious and time consuming procedure. The proper alignment demands that each of the printed layers are correctly positioned relative to the edges of the substrate base. This alignment procedure is particularly time consuming when the image to be printed is located relatively distant from the edge of the substrate. In usual practice a number of attempts at correct positioning are required, each of which entails printing a blank substrate and then measuring the image location on a precision optical comparator. After such an attempt is made, the image screen may of necessity be cleaned prior to the next attempt, or any initiation of production. Such cleaning step is required because the ink or paste dries readily on the screen. Additionally, if the first attempt is not correct and another attempt is needed, the screen of course must be repositioned. It should be further noted that the detection of any inconsistencies in the pattern location requires extensive measurement on an optical comparator. Obviously if this measurement has not been made, a potentially defective product may be subjected to further processing with the additional loss of time and extensive additional cost.

SUMMARY OF THE INVENTION

The present invention consists of the addition of marks to the original screened artwork or master pattern useful in printing thick film circuits onto a substrate base and more particularly for the placement of marks on the first screen printed layer of the thick film circuit which is going to be projected onto the ceramic substrate base. The marks are so positioned that they will be very close to some of the edges of the substrate base when the thick film circuit subsequently is printed in correct register onto the substrate base. As envisioned, the registration marks are generally arrow shaped, with the pointed end positioned right on the line or the location which will mark the exact edge of the substrate when printing takes place. In this manner, when the operator sets up the printing machine, determining the relative positions between the substrate base and the screened image is easily accomplished with a high degree of accuracy.

As noted, the aforegoing registration marks are particularly valuable because when printing thick film circuits, the first layer printed must be properly located relative to the substrate base. This first layer as printed is registered to the base. Then subsequent layers are each registered to those which have been printed previously. Said subsequent layer printing is relatively easy to determine as to the proper location because of pattern relationship, however, the first layer is extremely critical. The most difficult circuitry includes that wherein the pattern is not close to the edge and it is difficult to visually determine exactly where the edge of the substrate will be located. To enhance the setup of these layers on the screen printing machine, visual indicators as set forth in the present invention on the artwork master are provided. As will be obvious, initial alignment of the image then is much easier to effect. Likewise, another advantage includes that of monitoring alignment during the course of the production run since again the printed indicators or registration marks can be compared constantly with the edge location of the substrate to determine if proper alignment has been maintained. It will be very obvious to the operator when the image has moved on the substrate.

From the foregoing it will be obvious that it is the object of the present invention to provide a new and useful technique for assuring proper alignment or registration of an imaged screen to a substrate in the first layer of printing a thick film circuit on a ceramic substrate base.

DESCRIPTION OF THE PREFERRED EMBODIMENT

Figure 1:
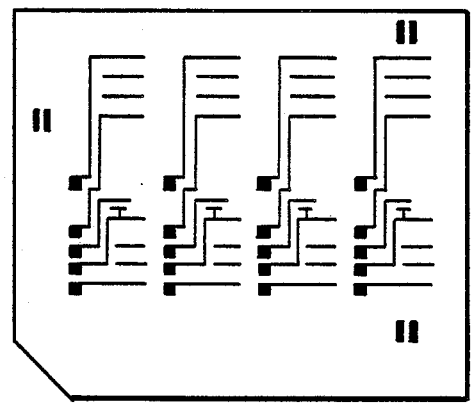
FIG. 1 demonstrates the printing of artwork on a ceramic substrate base in correct positioning as present in the prior art.

Referring first to FIG. 1, a first printed circuit layer is shown on a ceramic substrate in proper location. Determination that the pattern is correctly located on the substrate must be accomplished by use of an image comparator so that the various portion of the artwork or master pattern are correctly located relative to the edge of the substrate.

Figure 3:
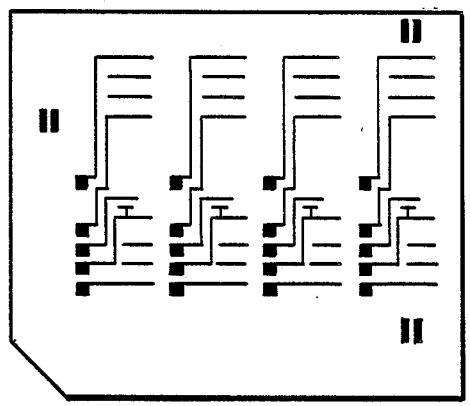
FIGS. 3 and 5 show incorrectly positioned artwork on ceramic substrates as might be present in prior art techniques.
Figure 5:
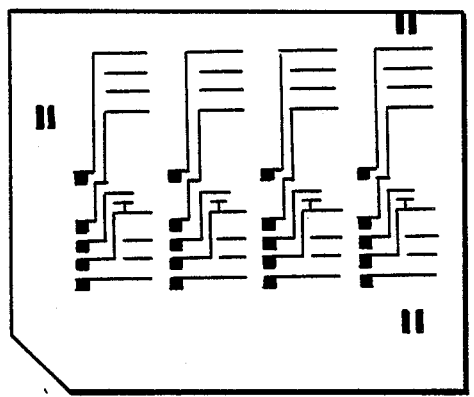

References to additional prior art FIGS. 3 and 5, which show improperly positioned artwork. Determination that the locations are incorrect is extremely difficult requiring the additional steps of utilizing a precision optical comparator to make said determination.

Figure 2:
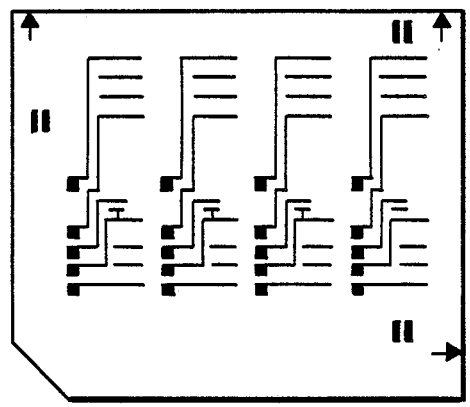
FIG. 2 shows the correct positioning of artwork on a ceramic substrate to achieve proper registration utilizing the indicators taught by the present invention.

Reference is now made to FIG. 2 wherein arrow shaped registration marks are placed adjacent to the top edge of the artwork and therefore will be imprinted on the ceramic substrate and also with a single arrow shaped registration mark along the right edge. The marks are so positioned that the point of each arrow should be located right on the very edge of the substrate to be printed. As seen in FIG. 2, the proper location for the basic circuitry 1 is determined by the positioning of registration marks 2 and 3 with the point of the arrow positioned exactly on the upper edge near both the left and right sides. The arrows then determine proper vertical alignment.

Horizontal alignment, after the vertical alignment has been made, can be determined by the proper location of the arrow registration mark 4 wherein the point of the arrow is located immediately on the edge of the substrate as seen in FIG. 2. Thus, by proper alignment of registration marks 2, 3 and 4, artwork for the basic thick film circuit first layer, 1, is in its proper location.

Figure 4:
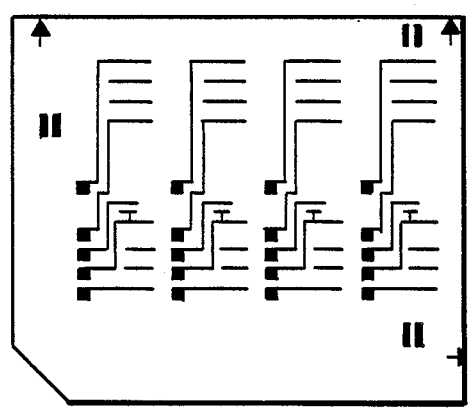
FIGS. 4 and 6 show incorrectly positioned artwork on ceramic substrates which can be detected utilizing the indicators of the present invention.

Reference is now made to FIGS. 3 and 4 wherein the proper vertical orientation of the artwork is shown. The artwork in FIGS. 3 and 4 being in exactly the same location, with the exception that in FIG. 4 where registration marks in accordance with the present invention are shown. It can be readily seen by reference to FIG. 4 that vertical orientation is correct inasmuch as registration marks 2 and 3 are properly located with the point of the arrow along the top edge of the ceramic substrate. It will also be noted that only a portion of the registration mark 4 shows and accordingly the entire pattern has been moved to the right and therefore is incorrectly located on the ceramic substrate. As can be seen in FIG. 3 whether this location is proper or not is very difficult to determine without taking detailed measurements. But a simple viewing of the registration marks as shown in FIG. 4 makes an equivalent determination without the difficulty presented by the prior art techniques.

Figure 6:
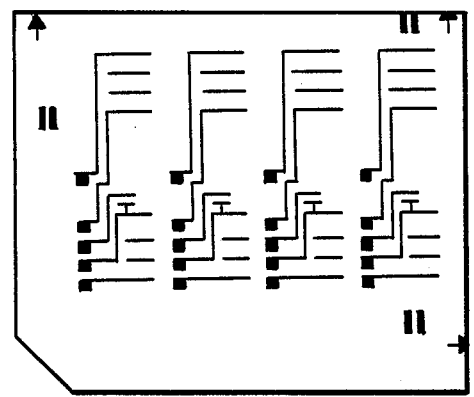

Referring now to FIGS. 5 and 6 in which the thick film circuit first layer is skewed, it is not very apparent from reference to FIG. 5 that such skewing is taking place. However, reference to FIG. 6 which includes registration marks as taught by the present invention will show that registration mark 2 is not in contact with the edge of the ceramic substrate while registration mark 3 is partially obscured and therefore the angular relationship is incorrect as far as the basic artwork 1 is concerned. Further, registration mark 4 is also partly obscured indicating that the location again of the artwork is incorrect.

Certainly, as noted previously, the initial alignment of the first layer of the image is much easier to affect, by means of the present invention. For example, if the indicators are placed 0.010 inches from the edge of the base and the next closest feature is 0.250 inches from the edge, a change in position of 0.015 inches will be obvious with the former and almost imperceptible with the latter.

It will be obvious from the foregoing that numerous modifications of the present invention can be made without departing from the spirit of the invention which shall be limited only by the scope of the claims appended hereto.

What is claimed is:

1. Positioning means for projecting a precision location of a screen artwork pattern as used in printing a thick film circuit on a ceramic substrate base, said positioning means comprising:
   a plurality of registration marks on said artwork pattern, said artwork pattern going to be projected onto a ceramic substrate base, and said plurality of registration marks being located immediately adjacent to a location determined as an edge of said substrate base when said substrate is in correct register with said artwork pattern.

2. Positioning means as claimed in claim 1 wherein:
   said plurality of registration marks each include an arrow shaped end in contact with said location immediately adjacent to said substrate base edge location.

3. Positioning means as claimed in claim 2 wherein:
   said plurality of registration marks each include a pair of marks positioned on said artwork pattern in a location immediately adjacent to a location determined as a top edge of said substrate base.

4. Positioning means as claimed in claim 2 wherein:
   said plurality of registration marks include a single mark positioned on said artwork pattern in a location immediately adjacent to a location determined as a right edge of said substrate base.

5. Positioning means as claimed in claim 3 wherein:
   said pair of registration marks are spaced apart from each other so that one of said pair is further positioned adjacent to a right edge of said substrate base and said other registration mark of said pair is located adjacent to a left edge of said substrate base.

6. Positioning means as claimed in claim 4 wherein:
   said single registration mark is further located in a location adjacent to a location determined as a bottom edge of said substrate base.

* * * * *